United States Patent
Yu

(10) Patent No.: US 7,180,044 B2
(45) Date of Patent: Feb. 20, 2007

(54) IMAGE SENSOR DEVICE WITH COLOR FILTERS AND MANUFACTURING METHOD THEREOF

(75) Inventor: Cheng-Hung Yu, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 258 days.

(21) Appl. No.: 11/003,515

(22) Filed: Dec. 3, 2004

(65) Prior Publication Data

US 2006/0118698 A1    Jun. 8, 2006

(51) Int. Cl.
*H01L 27/00* (2006.01)
(52) U.S. Cl. .................. 250/208.1; 250/239
(58) Field of Classification Search ......... 250/208.1, 250/239, 226, 214.1; 257/291, 290, 294, 257/258, 440
See application file for complete search history.

(56) References Cited

U.S. PATENT DOCUMENTS 5,514,888 A * 5/1996 Sano et al. ............... 257/232

* cited by examiner

*Primary Examiner*—Que T. Le
(74) *Attorney, Agent, or Firm*—J.C. Patents

(57) ABSTRACT

An image sensor device including a substrate, a plurality of photo sensors, a dielectric layer, a planar layer, a plurality of color filters, a plurality of microlenses, and a shield layer is provided. The photo sensors are disposed in the substrate, and the dielectric layer is disposed over the photo sensors and the substrate. The planar layer is disposed over the dielectric layer. The color filters are disposed in the planar layer, wherein each of the color filters is disposed over each of the photo sensors. The microlenses are disposed over the planar layer, wherein each of the microlenses is disposed over each of the color filter. The shield layer including a plurality of openings is disposed in the planar layer and is disposed under or over the color filters, wherein each of the openings is disposed over each of the color filters.

25 Claims, 8 Drawing Sheets

IMAGE SENSOR DEVICE WITH COLOR FILTERS AND MANUFACTURING METHOD THEREOF

BACKGROUND OF THE INVENTION

1. Field of the Invention

The present invention is generally related to an image sensor device and a manufacturing method thereof. More particularly, the present invention relates to an image sensor device and a manufacturing method thereof for preventing light leakage between different pixels and for reducing the focal length thereof.

2. Description of Related Art

Conventionally, a charge coupled device (CCD) or a complementary metal oxide semiconductor (CMOS) image sensor (CMOS Image Sensor, "CIS") is used for a solid-state image sensor. A conventional CCD comprises a photodiode array, and pulsed voltage is applied to the charge stored by each photodiode, so as to output a corresponding electric signal. The CCD has the advantages of high dynamic range and low dark current; however, the cost is high and the manufacturing process is complicated. In recent years, CMOS image sensor has been well developed for being compatible with the manufacturing process of a CMOS transistor. Therefore, CMOS image sensor including a chip with a photodiode and a MOS transistor is used as a solid-state image sensor. A CMOS image sensor can be easily manufactured and the chip size thereof can be reduced. In addition, the CMOS image sensor can be easily integrated on a chip having other peripheral circuits, and thus the cost and the power consumption of an image sensor can be reduced. In general, a CMOS image sensor is preferable to a CCD in a low cost image sensing application.

FIG. 1 is a schematic cross-sectional view illustrating a conventional image sensor device. Referring to FIG. 1, a conventional image sensor device 100 includes a plurality of photo sensors 102, a plurality of active regions 104, a dielectric layer 106, an oxy-nitride layer 108, a plurality of color filters 110, a planar layer 112 and a plurality of microlenses 114. The photo sensors 102 include photodiodes. The photo sensors 102, the color filters 110 and the microlenses 114 are arranged as an array. The distance between the photo sensor 102 and the microlens 114 is represented as the focal length FL of the image sensor device 100.

In a solid-state image sensor such as CCD or CMOS image sensor described above, the problem of light leakage between different pixels is an important issue that may influence the photo sensitivity of the image sensor device. FIG. 2 schematically illustrates the crosstalk of the image sensor device shown in FIG. 1. Referring to FIG. 2, for example, the sensor 102a is used to receive the light 202 of the image. However, the light 204 incident from the neighboring pixels that has a large incident angle between the light 204 and the normal line N of the microlens 114 may be received by the sensor 102a. In addition, the light 206 incident from the gap between the color filters 110 may also be received by the sensor 102a. Furthermore, the image quality of the sensor 102a may be influenced by the scattering lights of the light 208 reflected from the active regions 104.

Accordingly, the color contrast of the image sensor device may be reduced by the crosstalk between the pixels of the image sensor device. Therefore, the photo sensitivity of the image is also reduced. Accordingly, an image sensor that can prevent light leakage between different pixels for resolving the problem of crosstalk is quite desirable.

SUMMARY OF THE INVENTION

Accordingly, the present invention is directed to an image sensor device for preventing light leakage between different pixels to solve the problem of crosstalk. Thus, the color contrast and the photo sensitivity of the image sensor are enhanced.

In addition, the present invention is directed to a method of manufacturing an image sensor device for preventing light leakage between different pixels to solve the problem of crosstalk. Thus, the color contrast and the photo sensitivity of the image sensor are enhanced.

In accordance with one embodiment of the present invention, an image sensor device comprising a substrate, a plurality of photo sensors, a dielectric layer, a planar layer, a plurality of color filters, a plurality of microlenses, and a shield layer is provided. The photo sensors are disposed in the substrate, and the dielectric layer is disposed over the photo sensors and the substrate. The planar layer is disposed over the dielectric layer. The color filters are disposed in the planar layer, wherein each of the color filters is disposed over each of the photo sensors. The microlenses are disposed over the planar layer, wherein each of the microlenses is disposed over each of the color filter. The shield layer including a plurality of openings is disposed in the planar layer and under or over the color filters, wherein each of the openings is disposed over each of the color filters.

In accordance with one embodiment of the present invention, a method of forming an image sensor device is provided. The method includes, for example but not limited to, the following steps. First, a substrate is provided. Next, a plurality of photo sensors is formed in the substrate. Then, a dielectric layer is formed over the photo sensors and the substrate. A plurality of color filters and a shield layer are further formed over the dielectric layer, wherein the shield layer is disposed under or over the color filters. Each of the color filters is disposed over each of the photo sensors, wherein the shield layer comprises a plurality of openings and each of the openings is disposed over each of the photo sensors. Thereafter, a planar layer is formed over the dielectric layer and covers the color filters and the shield layer. A plurality of microlenses is formed over the planar layer, wherein each of the microlenses is disposed over each of the color filter.

In accordance with one embodiment of the present invention, an image sensor device comprising a substrate, a plurality of photo sensors, a dielectric layer, a planar layer, a plurality of color filters, a plurality of microlenses, and a shield layer is provided. The photo sensors are disposed in the substrate, and the dielectric layer is disposed over the photo sensors and the substrate. The planar layer is disposed over the dielectric layer. The color filters are disposed in the planar layer, wherein each of the color filters is disposed over each of the photo sensors. The shield layer including a plurality of openings is disposed over the planar layer, wherein each of the openings is disposed over each of the color filters. The microlenses are disposed over the planar layer, wherein each of the microlenses is disposed in each of the openings.

In accordance with one embodiment of the present invention, a method of forming an image sensor device is provided. The method includes, for example but not limited to, the following steps. First, a substrate is provided. Next, a plurality of photo sensors is formed in the substrate. Then, a dielectric layer is formed over the photo sensors and the substrate. A plurality of color filters is formed over the dielectric layer, wherein each of the color filters is disposed over each of the photo sensors. Thereafter, a planar layer is formed over the dielectric layer and the planar player covers the color filters. A shield layer and a plurality of microlenses are formed over the planar layer, wherein the shield layer comprises a plurality of openings, and each of the openings is disposed over each of the photo sensors, wherein each of the microlenses is disposed in each of the opening.

In one embodiment of the present invention, each color filter may comprise, for example, a red color filter, a green color filter, or a blue color filter. Alternatively, each color filter may comprise, for example, a cyan color filter, a magenta color filter, or a yellow color filter.

In one embodiment of the present invention, the photo sensors comprise a charge coupled device (CCD) image sensor or a complementary metal oxide semiconductor (CMOS) image sensor.

In one embodiment of the present invention, a shape of the shield layer comprises a rectangular shape or a taper shape.

In one embodiment of the present invention, a transmittance of visible light of the shield layer is less than 10%.

Accordingly, in the present invention, since the shield layer is provided for absorbing the leaked light from the gap between the pixels and provided for preventing the light leakage between neighboring pixels, the problem of light leakage and crosstalk of the image sensor device is solved. In general, the shield layer may absorb at least all the visible lights of the leaked light. In addition, the incident light of any pixel will be confined in the opening of the shield layer. Therefore, the concentration and the focusing of the incident light are enhanced by the opening. Thus, the color contrast and the photo sensitivity of the image sensor are also enhanced. In addition, if the material of the shield layer is similar to that of the color filters, the shield layer may be formed by using the method of forming the color filters. Therefore, the cost and the process time are not increased.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
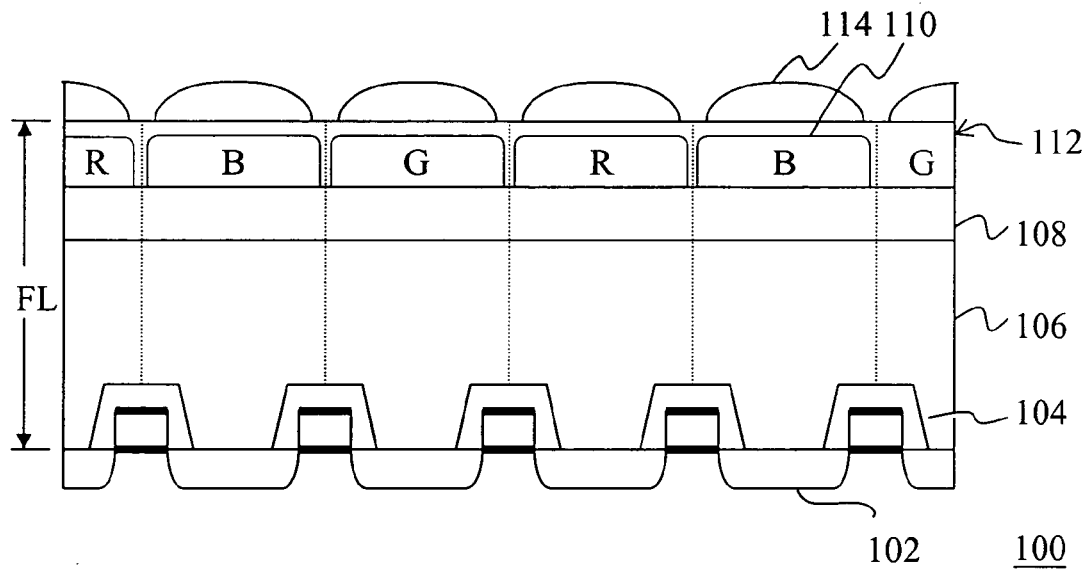
FIG. 1 is a schematic cross-sectional view of a conventional image sensor device.
Figure 2:
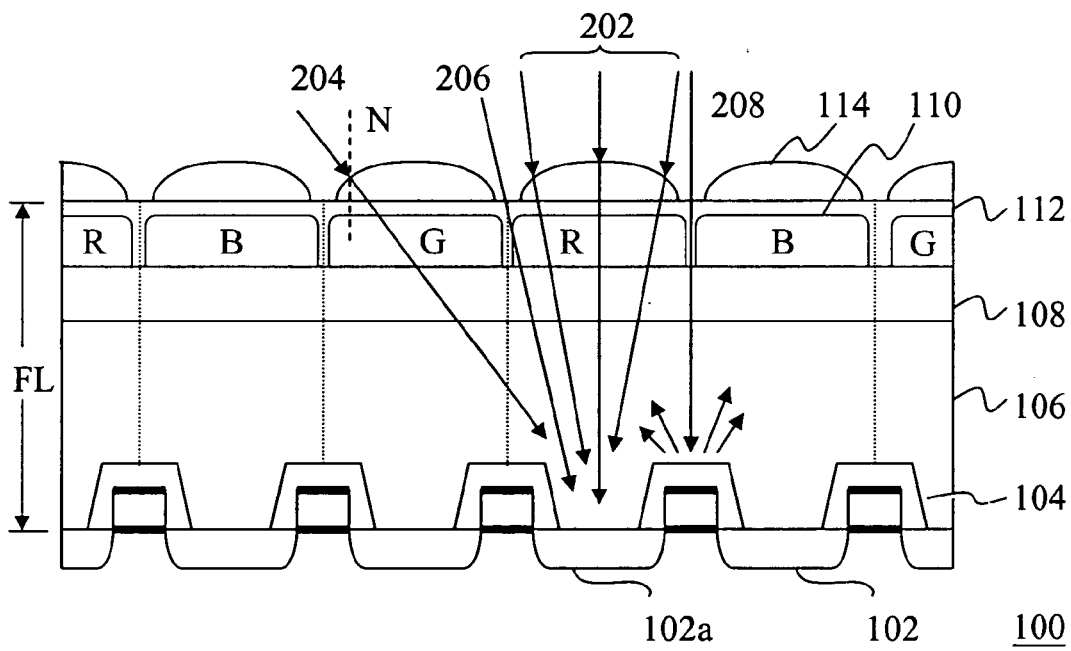
FIG. 2 schematically illustrates the crosstalk of the image sensor device shown in FIG. 1.
Figure 3:
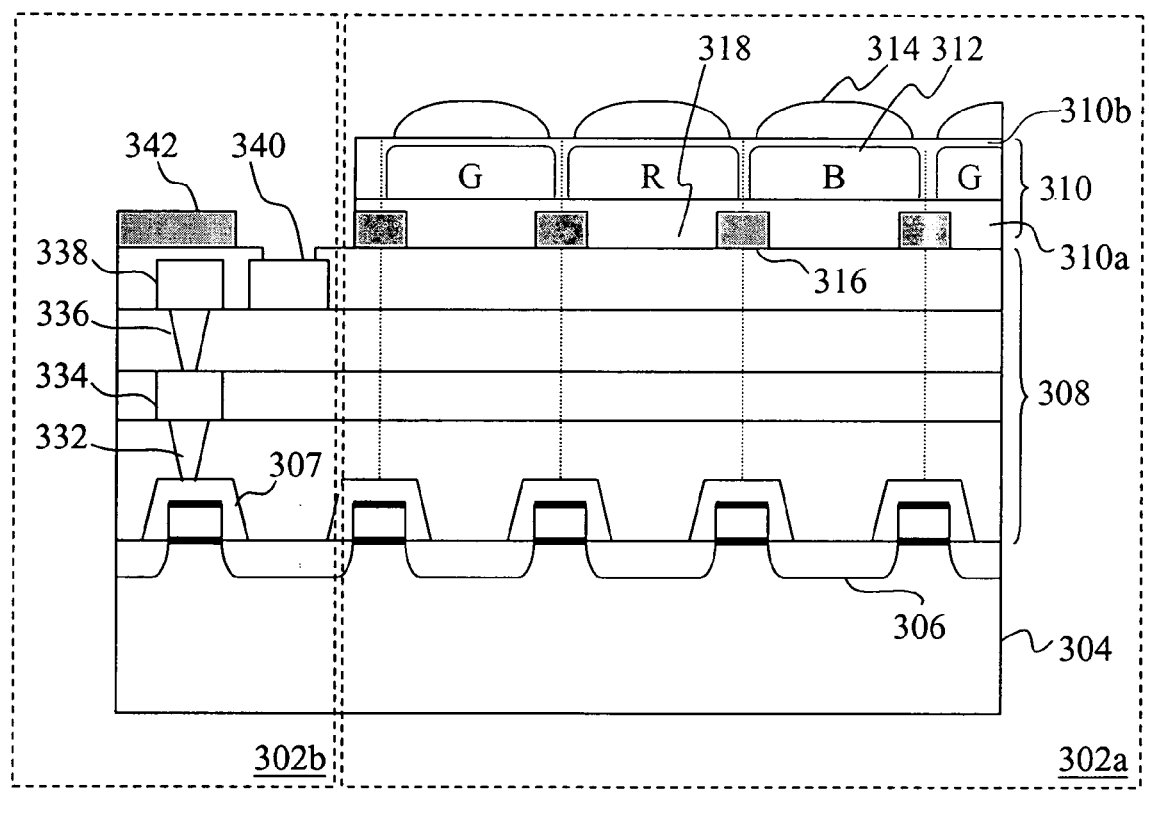
FIG. 3 is a schematic cross-sectional view of an image sensor means according to an embodiment of the present invention.
Figure 4:
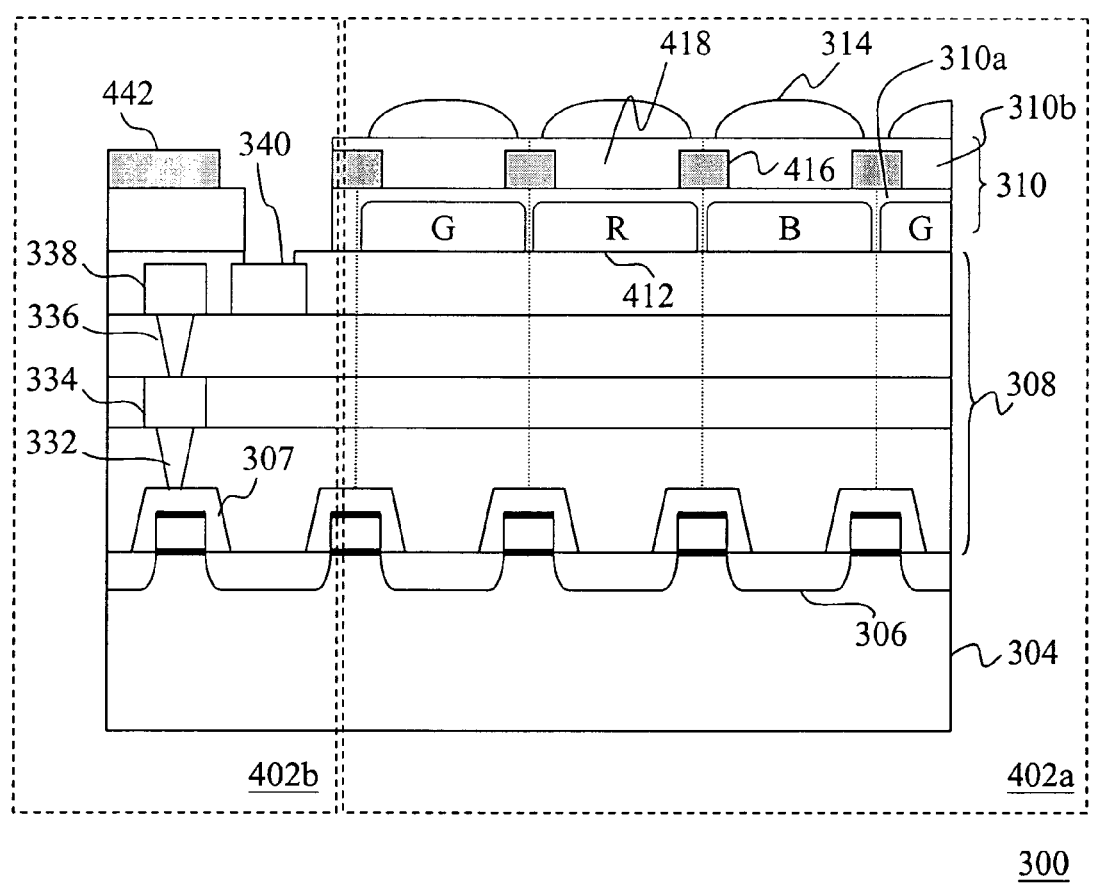
FIG. 4 is a schematic cross-sectional view of an image sensor means according to an embodiment of the present invention.

FIG. 3 and FIG. 4 are schematic cross-sectional views of the image sensor means according to the embodiments of the present invention. Referring to FIG. 3 (or FIG. 4), an image sensor means 300 comprises, for example but not limited to, an image sensor device 302a (or 402a) and a peripheral circuit device 302b (or 402b). The image sensor device 302a (or 402a) comprises a substrate 304, a plurality of photo sensors 306, a dielectric layer 308, a planar layer 310, a plurality of color filters 312 (or 412), a plurality of microlenses 314 and a shield layer 316 (or 416). The photo sensors 306 are disposed in the substrate 304. The dielectric layer 308 is disposed over the photo sensors 306 and the substrate 304. The planar layer 310 is disposed over the dielectric layer 308, and the color filters 312 or 412 are disposed in the planar layer 310, wherein each color filter 312 or 412 is disposed over one corresponding photo sensor 306. The microlenses 314 are disposed over the planar layer 310, wherein each microlens 314 is disposed over one corresponding color filter 312 or 412. The shield layer 316 or 416 is disposed in the planar layer 310 and comprises a plurality of openings 318 or 418, wherein each opening 318 or 418 is disposed over one corresponding color filter 312 or 412.

In one embodiment of the present invention, the photo sensor 306 comprises, for example but not limited to, a charge coupled device (CCD) image sensor or a complementary metal oxide semiconductor (CMOS) image sensor. In addition, each color filter may comprise, for example but not limited to, a red color filter, a green color filter, or a blue color filter. Alternatively, each color filter may comprise, for example, a cyan color filter, a magenta color filter, or a yellow color filter. It should be noted that, the arrangement of the green, red and blur color filters as shown in the drawings and embodiments of the present invention is only illustrated as an example, and should not be used to limit the scope of the present invention.

Figure 5:
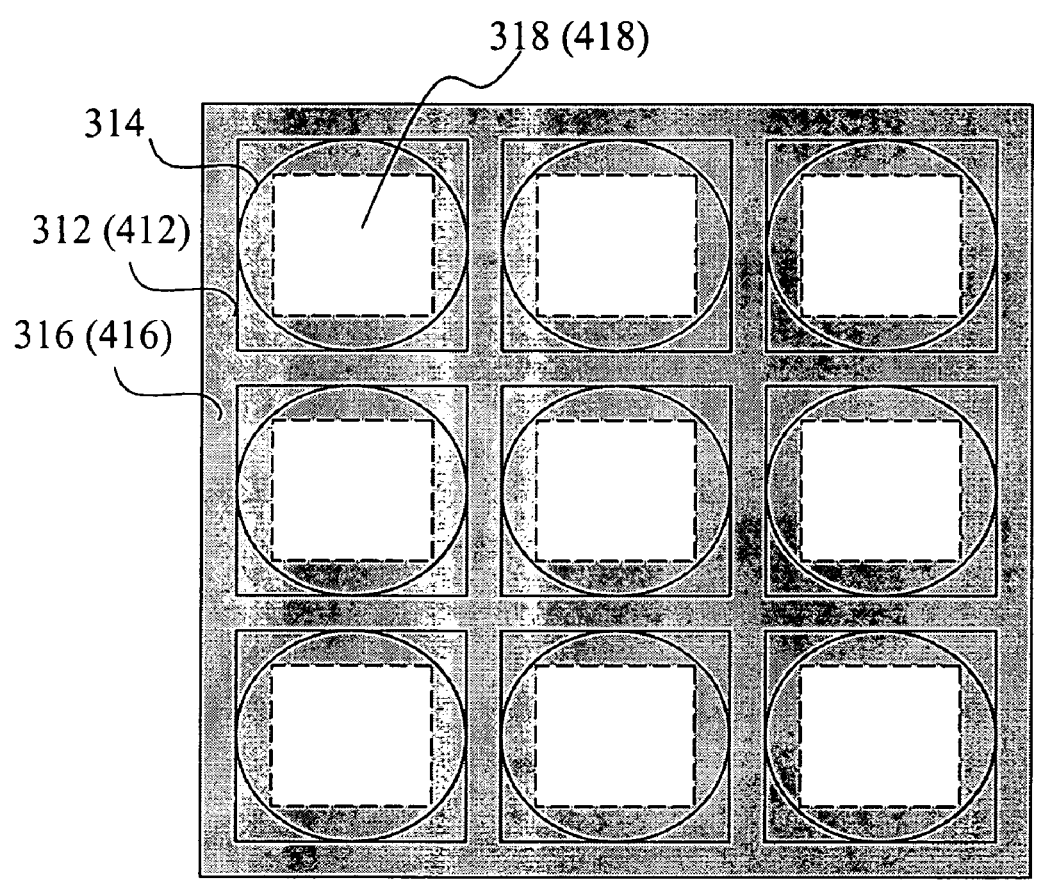
FIG. 5 is a schematic top view of the image sensor means shown in FIG. 3 or FIG. 4.

In one embodiment of the present invention, the planar layer 310 comprises, for example but not limited to, a first planar layer 310a and a second planar layer 310b. Referring to FIG. 3, the shield layers 316 are disposed in the first planar layer 310a and the color filters 312 are disposed in the second planar layer 310b. Therefore, the shield layers 316 are disposed under the color filters 312. Alternatively, in another embodiment of the present invention, referring to FIG. 4, the color filters 412 are disposed in the first planar layer 310a and the shield layers 416 are disposed in the second planar layer 310b. Therefore, the shield layers 416 are disposed over the color filters 412. FIG. 5 is a schematic top view of the image sensor means shown in FIG. 3 or FIG. 4. Referring to FIG. 5, it is noted that a microlens 314 and a color filter 312 or 412 are disposed over one corresponding opening 318 or 418 of the shield layer 316 or 416.

Referring to FIG. 3, the peripheral circuit device 302b comprises, for example but not limited to, the substrate 304, the dielectric layer 308, a plurality control circuits 307, a plurality of contacts 332, a plurality of first metal (M1) layers 334, a plurality of first vias 336, a plurality of second metal (M2) layers 338, a plurality of top metals 340, and a peripheral shield layer 342. The control circuits 307 are connected to the corresponding photo sensors 306 for controlling the photo sensors 306. The top metals 340 are used as bonding pads. The peripheral shield layer 342 is provided for sheltering the peripheral area of the image sensor device 302a from unexpected lights and absorbing the unexpected lights. The dielectric layer 308 may include a plurality of inter-metal dielectric (IMD) layers or a plurality of inter-layer dielectric (ILD) layers formed during the manufacturing process of, for example, the contacts 332, the M1 layers 334, the first vias 336, or the M2 layers 338. Referring to FIG. 4, the peripheral circuit device 402b includes, for example but not limited to, the first planar layer 310a disposed between the dielectric layer 310 and the peripheral shield layer 442. It is noted that, in another embodiment of the invention, the IMD layers may be one or more than one, and the vias may be disposed in any IMD layers. In addition, the image sensor device 302a and a peripheral circuit device 302b shown in FIG. 3 and FIG.4 are exemplary embodiments for describing the present invention and can not be used to limit the scope of the present invention.

Figure 6:
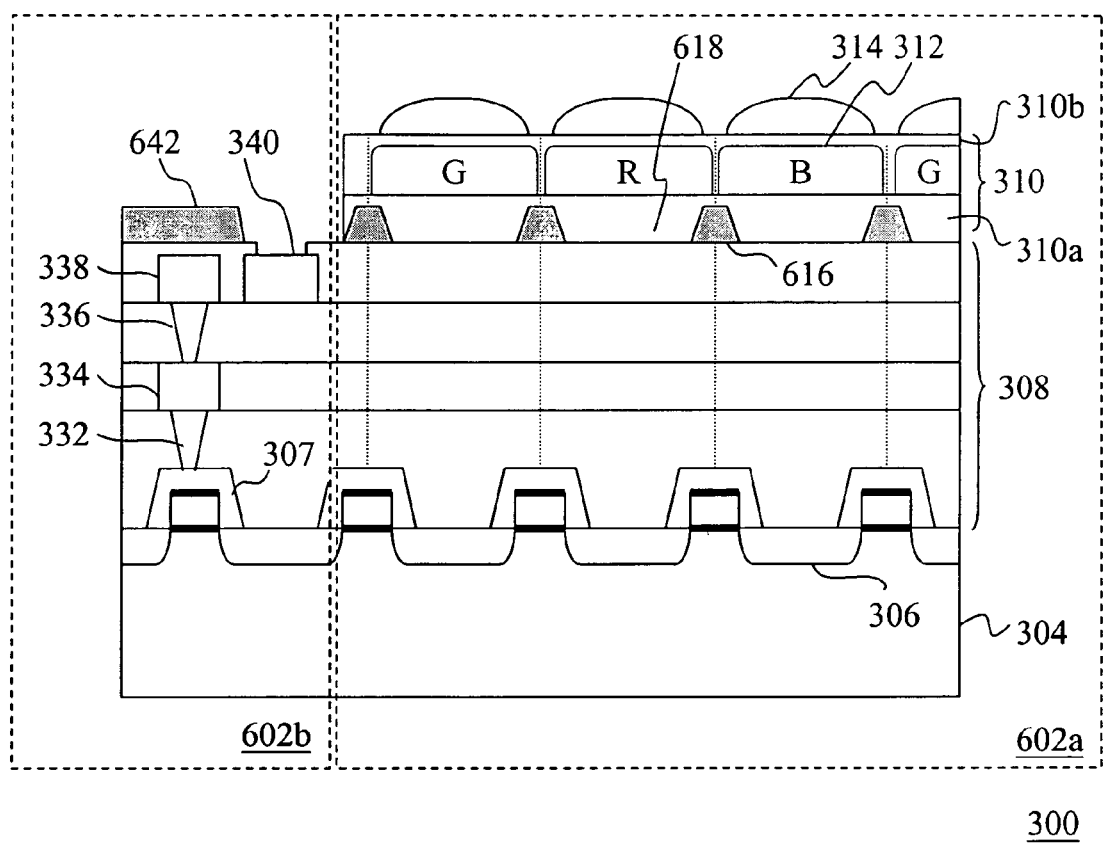
FIG. 6 is a schematic cross-sectional view of an image sensor according to one embodiment of the invention.

FIG. 6 is a schematic cross-sectional view illustrating an image sensor means according to an embodiment of the present invention. In the present embodiment, the only difference between FIG. 6 and FIG. 3 is that the shield layer 316 and the peripheral shield layer 342 of FIG. 3 have a rectangular shape, but the shield layer 616 and the peripheral shield layer 642 of FIG. 6 have a taper shape. It is noted that the rectangular shaped shield layer 416 and peripheral shield layer 442 of FIG. 4 may also be replaced by the taper shaped shield layer 616 and peripheral shield layer 642 shown in FIG. 6.

In summary, as shown in FIG. 6, the shield layer 616 is disposed corresponding to the gap between the color filters 312. Therefore, the unexpected light leaked from the gap between the color filters 312 and the microlenses 314 is absorbed and blocked by the shield layer 616. In addition, the incident light of any microlense 314 and the color filter 312 below will be confined in the opening 618 below. Therefore, the concentration and focusing of the incident light is enhanced by the corresponding opening 318 and the leakage of the incident light is prevented by the shield layer 616. In addition, the color contrast and the photo sensitivity of the image sensor device are enhanced. The embodiments shown in FIG. 3 or FIG. 4 also comprises the same functions of the present invention described above.

Figure 7:
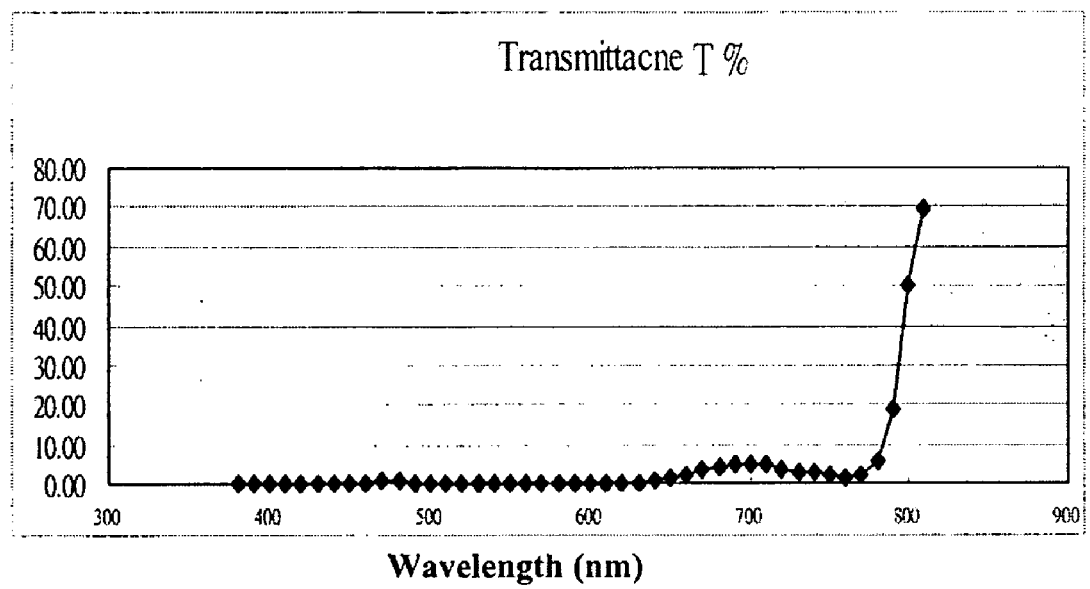
FIG. 7 is a plot illustrating the transmittance of a material of a shield layer of an image sensor device as a function of wavelength according to an embodiment of the present invention.

FIG. 7 is a plot illustrating the transmittance of a material of a shield layer of an image sensor device according to an embodiment of the present invention. It is noted that, in the wavelength range of visible light, for example, 350 nm to 700 nm, the visible light component of the unexpected light will be absorbed completely. In one embodiment of the present invention, a transmittance of visible light of the shield layer may be. For example, less than 10%, or preferably less than 5%.

Figure 8:
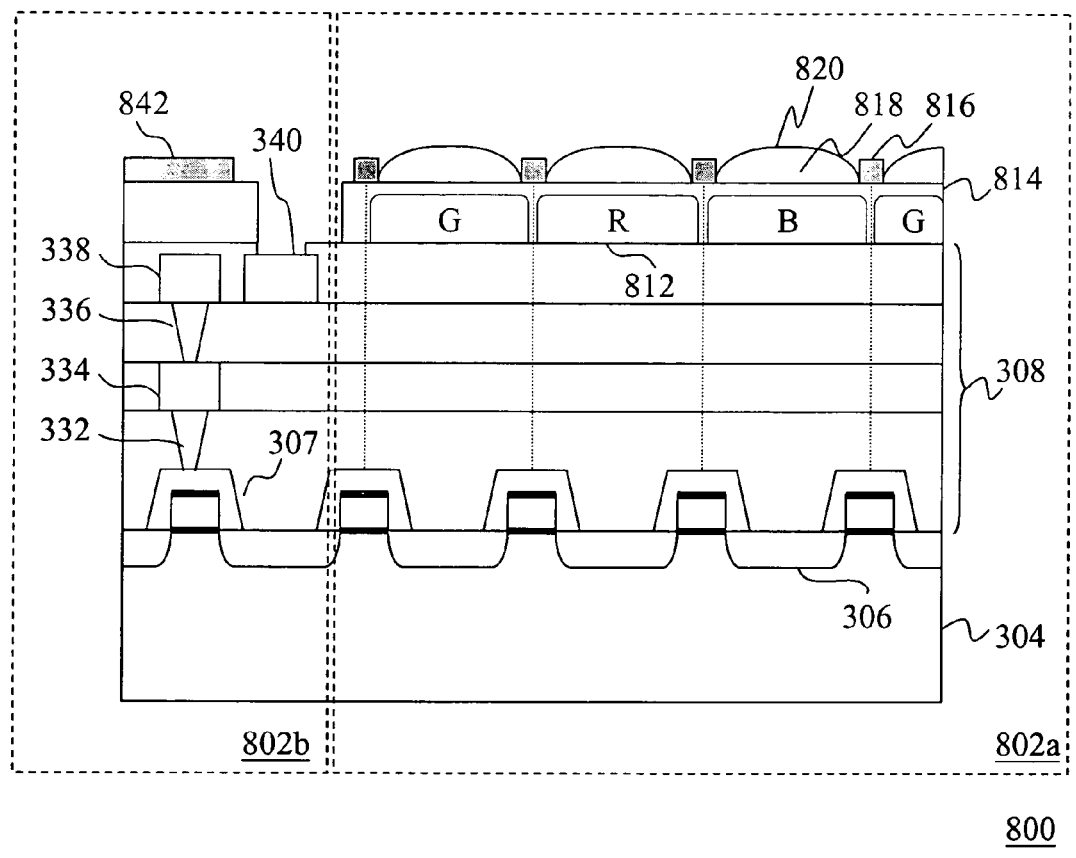
FIG. 8 is a schematic cross-sectional view of an image sensor means according to the embodiments of the present invention.

FIG. 8 is a schematic cross-sectional view of an image sensor means according to the embodiments of the present invention. It is noted that, the component shown in FIG. 8 similar to or the same as that shown in FIG. 3 will have the same reference numbers. Referring to FIG. 8, an image sensor means 800 includes, for example but not limited to, an image sensor device 802a and a peripheral circuit device 802b. The image sensor device 802a comprises a substrate 304, a plurality of photo sensors 306, a dielectric layer 308, a plurality of color filters 812, a planar layer 814, a shield layer 816 and a plurality of microlenses 820. The photo sensors 306 are disposed in the substrate 304. The dielectric layer 308 is disposed over the photo sensors 306 and the substrate 304. The color filters 812 are disposed over the dielectric layer 308, and each color filter 812 is disposed over one corresponding photo sensor 306. The planar layer 814 is disposed over the dielectric layer 308 and covers the color filters 812. The shield layer 816 is disposed over the planar layer 814 and comprises a plurality of openings 818, wherein each opening 818 is disposed over one corresponding photo sensors 306. The microlenses 820 are disposed over the planar layer 814, wherein each microlens 820 is disposed in one corresponding opening 818.

Figure 9:
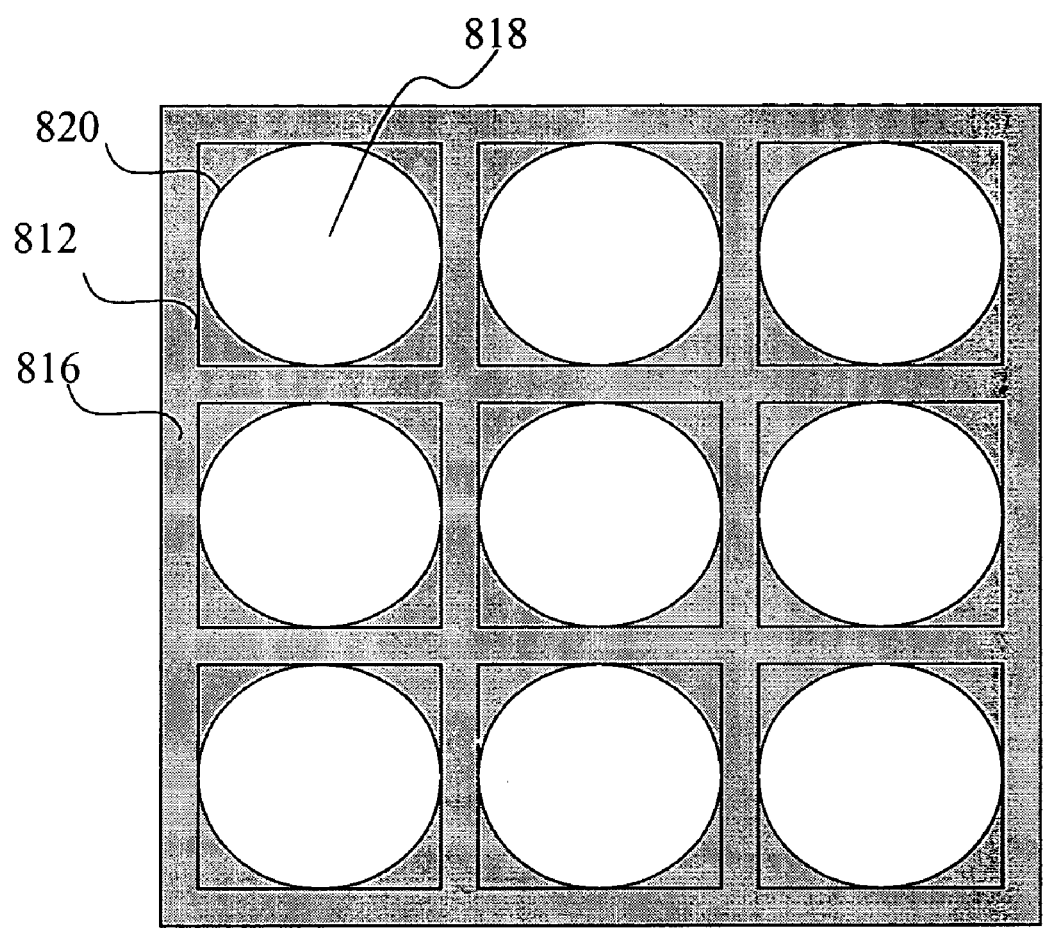
FIG. 9 is a schematic top view of the image sensor means shown in FIG. 8.

FIG. 9 is a schematic top view of the image sensor means shown in FIG. 8. Referring to FIG. 9, it is noted that each microlens 820 is disposed in one opening 818.

Referring to FIG. 8, the peripheral circuit device 802b is similar to or the same as the peripheral circuit device 302b shown in FIG. 3. In addition, the rectangular shaped shield layer 816 and peripheral shield layer 842 of FIG. 8 may also be replaced by a taper shaped shield layer 616 and a taper shaped peripheral shield layer 642 shown in FIG.6.

Hereinafter, the manufacturing process of the present invention will be described according to, for example but not limited to, FIG. 3, FIG. 4, FIG. 6 and FIG. 8. According to FIG. 3, FIG. 4, FIG. 6 and FIG. 8, first of all, a substrate 304 is provided. Next, a plurality of photo sensors 306 is formed in the substrate 304. Then, a dielectric layer 308 is formed over the substrate 304 and the photo sensors 306. The dielectric layer 308 may be formed by, for example but not limited to, a conventional manufacturing process to form the contacts 332, the M1 layers 334, the first vias 336, the M2 layers 338, the top metals 340, and a plurality of inter-metal dielectric (IMD) layers or a plurality of inter-layer dielectric (ILD) layers.

Thereafter, referring to FIG. 3 or FIG. 4, a plurality of color filters 312 or 412 and a shield layer 316, 416 are formed over the dielectric layer 308. In FIG. 3, the shield layer 316 is disposed under the color filters 312, and in FIG. 4, the shield layer 416 is disposed over the color filters 412. Each color filter 312 or 412 is disposed over one corresponding photo sensor 306. The shield layer 316 or 416 comprises a plurality of openings 318 or 418, and each opening 318 or 418 is disposed over one corresponding photo sensor 306. Next, a planar layer 310 is formed over the dielectric layer 308 and covers the color filters 312 or 412 and the shield layer 316 or 416. Then, a plurality of microlenses 314 is formed over the planar layer 310, and each microlens 314 is disposed over each of the color filter 312 or 412.

Referring to FIG. 3, it is noted that the shield layer 316 is disposed under the color filters 312. In one embodiment of the present invention, the color filters 312 and the shield layer 316 are formed over, for example but not limited to, the following steps. First, the shield layer 316 comprising a plurality of openings 318 is formed over the dielectric layer 308, and each opening 318 is disposed over one corresponding photo sensor 306. Then, a first planar layer 310a is formed over the dielectric layer 308 and the first planar layer 310a covers the shield layer 316. Next, the color filters 312 are formed over the first planar layer 310a, and each color filter 312 is disposed over one corresponding photo sensor 306. Then, a second planar layer 310b is formed over the first planar layer 310a, covering the color filters 312. Therefore, the planar layer 310 comprises the first planar layer 310a and the second planar layer 310b. The manufacturing method of the image sensor means shown in FIG. 6 is similar to that shown in FIG. 3 described above.

Alternatively, referring to FIG. 4, it is noted that the shield layer 416 is disposed over the color filters 412. In one embodiment of the present invention, the color filters 412 and the shield layer 416 are formed over, for example but not limited to, the following steps. First, the color filters 412 are formed over the dielectric layer 308, and each color filter 412 is disposed over one corresponding photo sensor 306. Next, a first planar layer 310a is formed over the dielectric layer 308 and covers the color filters 412. Then, the shield layer 416 is formed over the first planar layer 310a. The shield layer 416 comprises a plurality of openings 418, and each opening 418 is disposed over one corresponding photo sensor 306. A second planar layer 310b is formed over the first planar layer 310a and the second planar layer 310b covers the shield layer 416, wherein the planar layer 310 comprises the first planar layer 310a and the second planar layer 310b.

Alternatively, referring to FIG. 8, the method of forming the substrate 304, the photo sensors 306, and the dielectric layer 308 are similar to that illustrated in FIG. 3 or FIG. 4 described above. After the dielectric layer 308 is formed, a plurality of color filters 812 is formed over the dielectric layer 308, wherein each color filter 812 is disposed over one corresponding photo sensor 306. Next, a planar layer 814 is formed over the dielectric layer 308 and the planar layer 814 covers the color filters 812. Then, a shield layer 816 comprising a plurality of openings 818 and a plurality of microlenses 820 is formed over the planar layer 814, wherein each opening 818 is disposed over one corresponding photo sensor 306, and each microlens 820 is disposed in one corresponding opening 818.

Accordingly, in the present invention, since the shield layer is provided for absorbing the leaked light from the gap between the pixels and for preventing the light leakage between neighboring pixels, the problem of light leakage and crosstalk of the image sensor device is solved. In general, the shield layer may absorb at least all the visible lights of the leaked light. In addition, the incident light of any pixel will be confined in the opening of the shield layer. Therefore, the concentration and the focusing of the incident light are enhanced by the opening. Thus, the color contrast and the photo sensitivity of the image sensor are also enhanced. In addition, if the material of the shield layer is similar to that of the color filters, the shield layer may be formed by using the method of forming the color filters. Therefore, the cost and the process time are not increased.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An image sensor device, comprising:
    a substrate;
    a plurality of photo sensors, disposed in the substrate;
    a dielectric layer, disposed over the photo sensors and the substrate;
    a planar layer, disposed over the dielectric layer;
    a plurality of color filters, disposed in the planar layer, wherein each of the color filters is disposed over each of the photo sensors;
    a plurality of microlenses, disposed over the planar layer, wherein each of the microlenses is disposed over each of the color filter; and
    a shield layer comprising a plurality of openings, wherein the shield layer is disposed in the planar layer and is disposed under or over the color filters, wherein each of the openings is disposed over each of the color filters.

2. The image sensor device of claim 1, wherein each of the color filters comprise a red color filter, a green color filter, or a blue color filter.

3. The image sensor device of claim 1, wherein each of the color filters comprises a cyan color filter, a magenta color filter, or a yellow color filter.

4. The image sensor device of claim 1, wherein the photo sensors is a charge coupled device (CCD) image sensor or a complementary metal oxide semiconductor (CMOS) image sensor.

5. The image sensor device of claim 1, wherein the shield layer is a rectangular shape or a taper shape.

6. The image sensor device of claim 1, wherein a transmittance of visible light of the shield layer is less than 10%.

7. A method of forming an image sensor device, comprising:
    providing a substrate;
    forming a plurality of photo sensors in the substrate;
    forming a dielectric layer over the photo sensors and the substrate;
    forming a plurality of color filters and a shield layer over the dielectric layer, wherein the shield layer is disposed under or over the color filters, and each of the color filters is disposed over each of the photo sensors, wherein the shield layer comprises a plurality of openings and each of the openings is disposed over each of the photo sensors;

forming a planar layer over the dielectric layer, wherein the planar layer covers the color filters and the shield layer; and forming a plurality of microlenses over the planar layer, wherein each of the microlenses is disposed over each of the color filter.

8. The method of claim 7, wherein when the shield layer is disposed under the color filters, the step of forming the color filters and the shield layer over the dielectric layer comprises:

forming the shield layer over the dielectric layer, wherein the shield layer comprises a plurality of openings, and each of the openings is disposed over each of the photo sensors; and forming a first planar layer over the dielectric layer, wherein the first planar layer covers the shield layer;

forming the color filters over the first planar layer, wherein each of the color filters is disposed over each of the photo sensors; and forming a second planar layer over the first planar layer and the second planar layer covering the color filters, wherein the planar layer comprises the first planar layer and the second planar layer.

9. The method of claim 7, wherein when the shield layer is disposed over the color filters, the step of forming the color filters and the shield layer over the dielectric layer comprises:

forming the color filters over the dielectric layer, wherein each of the color filters is disposed over each of the photo sensors;

forming a first planar layer over the dielectric layer, wherein the first planar layercovers the color filters;

forming the shield layer over the first planar layer, wherein the shield layer comprises a plurality of openings, and each of the openings is disposed over each of the photo sensors; and forming a second planar layer over the first planar layer and the second planar layer covering the shield layer, wherein the planar layer comprises the first planar layer and the second planar layer.

10. The method of claim 7, wherein each of the color filter comprises a red color filter, a green color filter, or a blue color filter.

11. The method of claim 7, wherein each of the color filters comprises a cyan color filter, a magenta color filter, or a yellow color filter.

12. The method of claim 7, wherein the photo sensors are a charge coupled device (CCD) image sensor or a complementary metal oxide semiconductor (CMOS) image sensor.

13. The method of claim 7, wherein the shield layer is a rectangular shape or a taper shape.

14. The method of claim 7, wherein a transmittance of visible light of the shield layer is less than 10%.

15. An image sensor device, comprising:
a plurality of photo sensors and a substrate;
a dielectric layer, disposed over the photo sensors and the substrate;
a planar layer, disposed over the dielectric layer;
a plurality of color filters, disposed in the planar layer, wherein each of the color filters is disposed over each of the photo sensors;
a shield layer comprising a plurality of openings, wherein the shield layer is disposed over the planar layer, and each of the opening is disposed over each of the color filters; and
a plurality of microlenses, disposed over the planar layer, wherein each of the microlenses is disposed in each of the openings.

16. The image sensor device of claim 15, wherein each of the color filters comprises a red color filter, a green color filter, or a blue color filter.

17. The image sensor device of claim 15, wherein each of the color filters comprises a cyan color filter, a magenta color filter, or a yellow color filter.

18. The image sensor device of claim 15, wherein the photo sensors are a charge coupled device (CCD) image sensor or a complementary metal oxide semiconductor (CMOS) image sensor.

19. The image sensor device of claim 15, wherein a transmittance of visible light of the shield layer is less than 10%.

20. A method of forming an image sensor device, comprising:
providing a substrate;
forming a plurality of photo sensors in the substrate;
forming a dielectric layer over the photo sensors and the substrate;
forming a plurality of color filters over the dielectric layer, wherein each of the color filters is disposed over each of the photo sensors,
forming a planar layer over the dielectric layer and the planar layer covering the color filters;
forming a shield layer and a plurality of microlenses over the planar layer, wherein the shield layer comprises a plurality of openings, and each of the openings is disposed over each of the photo sensors, wherein each of the microlenses is disposed in each of the opening.

21. The method of claim 20, wherein each of the color filters comprises a red color filter, a green color filter, or a blue color filter.

22. The method of claim 20, wherein each of the color filters comprises a cyan color filter, a magenta color filter, or a yellow color filter.

23. The method of claim 20, wherein the photo sensors are a charge coupled device (CCD) image sensor or a complementary metal oxide semiconductor (CMOS) image sensor.

24. The method of claim 20, wherein the shield layer is a rectangular shape or a taper shape.

25. The method of claim 20, wherein a transmittance of visible light of the shield layer is less than 10%.

* * * * *